United States Patent
McKay et al.

(10) Patent No.: US 7,595,704 B2
(45) Date of Patent: *Sep. 29, 2009

(54) SYSTEM AND APPARATUS FOR A THREE-LINE BALUN WITH POWER AMPLIFIER BIAS

(75) Inventors: Tom McKay, Felton, CA (US); Vas Postoyalko, Wakefield (GB); Edwin Li, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/076,721

(22) Filed: Mar. 21, 2008

(65) Prior Publication Data

US 2008/0174382 A1    Jul. 24, 2008

Related U.S. Application Data

(63) Continuation of application No. 11/119,156, filed on Apr. 29, 2005, now Pat. No. 7,385,458, which is a continuation of application No. 10/613,346, filed on Jul. 2, 2003, now Pat. No. 6,982,609, which is a continuation-in-part of application No. 10/262,336, filed on Sep. 30, 2002, now Pat. No. 7,283,793.

(60) Provisional application No. 60/381,387, filed on May 15, 2002.

(51) Int. Cl.
    *H03H 7/42* (2006.01)
    *H01P 3/08* (2006.01)
(52) U.S. Cl. .......................... 333/26; 333/238
(58) Field of Classification Search .............. 333/25, 333/26, 238
    See application file for complete search history.

(56) References Cited

U.S. PATENT DOCUMENTS

| | | | |
|---|---|---|---|
| 5,172,082 A | 12/1992 | Livingston et al. |
| 5,584,053 A | 12/1996 | Kommrusch et al. |
| 5,673,003 A | 9/1997 | Zocher |
| 5,867,072 A | 2/1999 | Logothetis |
| 6,009,314 A | 12/1999 | Bjork et al. |
| 6,040,745 A | 3/2000 | Tanaka et al. |
| 6,147,571 A | 11/2000 | Kitazawa et al. |
| 6,249,687 B1 | 6/2001 | Thomsen et al. |
| 6,278,340 B1 | 8/2001 | Liu |
| 6,294,965 B1 | 9/2001 | Merrill et al. |

(Continued)

FOREIGN PATENT DOCUMENTS

JP     2002050910 A  *  2/2002

OTHER PUBLICATIONS

Choonsik Cho, "A New Design Procedure for Single-Layer and Two-Layer Three-Line Baluns", IEEE Transactions On Microwave Theory And Techniques, vol. 46, No. 12, Dec. 1998.

*Primary Examiner*—Dean O Takaoka
(74) *Attorney, Agent, or Firm*—Sterne, Kessler, Goldstein & Fox, P.L.L.C.

(57) ABSTRACT

A balun that includes a first conductor, a second conductor, and a third conductor. The first conductor has a first length. The first conductor also has a first end connected to a first balanced power amplifier output port. The second conductor has substantially the same first length. The second conductor also includes a first end connected to a second balanced power amplifier output port and a second end connected to a second end of the first conductor. The third conductor has substantially the same first length. The third conductor has a first end connected to an antenna port and a second end connected to a ground potential.

20 Claims, 14 Drawing Sheets

U.S. PATENT DOCUMENTS

| | | | |
|---|---|---|---|
| 6,441,696 B1 | 8/2002 | Westberg | |
| 6,466,770 B1 | 10/2002 | Griffith et al. | |
| 6,470,173 B1 | 10/2002 | Okada et al. | |
| 6,653,885 B2 | 11/2003 | Wu et al. | |
| 6,670,866 B2 | 12/2003 | Ella et al. | |
| 6,735,418 B1 | 5/2004 | MacNally et al. | |
| 6,828,881 B2 | 12/2004 | Mizutani et al. | |
| 6,844,792 B1 | 1/2005 | Koeppe et al. | |
| 6,982,609 B1 | 1/2006 | McKay et al. | |
| 7,283,793 B1 | 10/2007 | McKay et al. | |
| 7,385,458 B2 | 6/2008 | McKay et al. | |
| 7,397,328 B2 * | 7/2008 | Yasuda et al. | 333/204 |
| 2002/0034934 A1 | 3/2002 | Watanabe et al. | |
| 2002/0163375 A1 | 11/2002 | Wu et al. | |

* cited by examiner

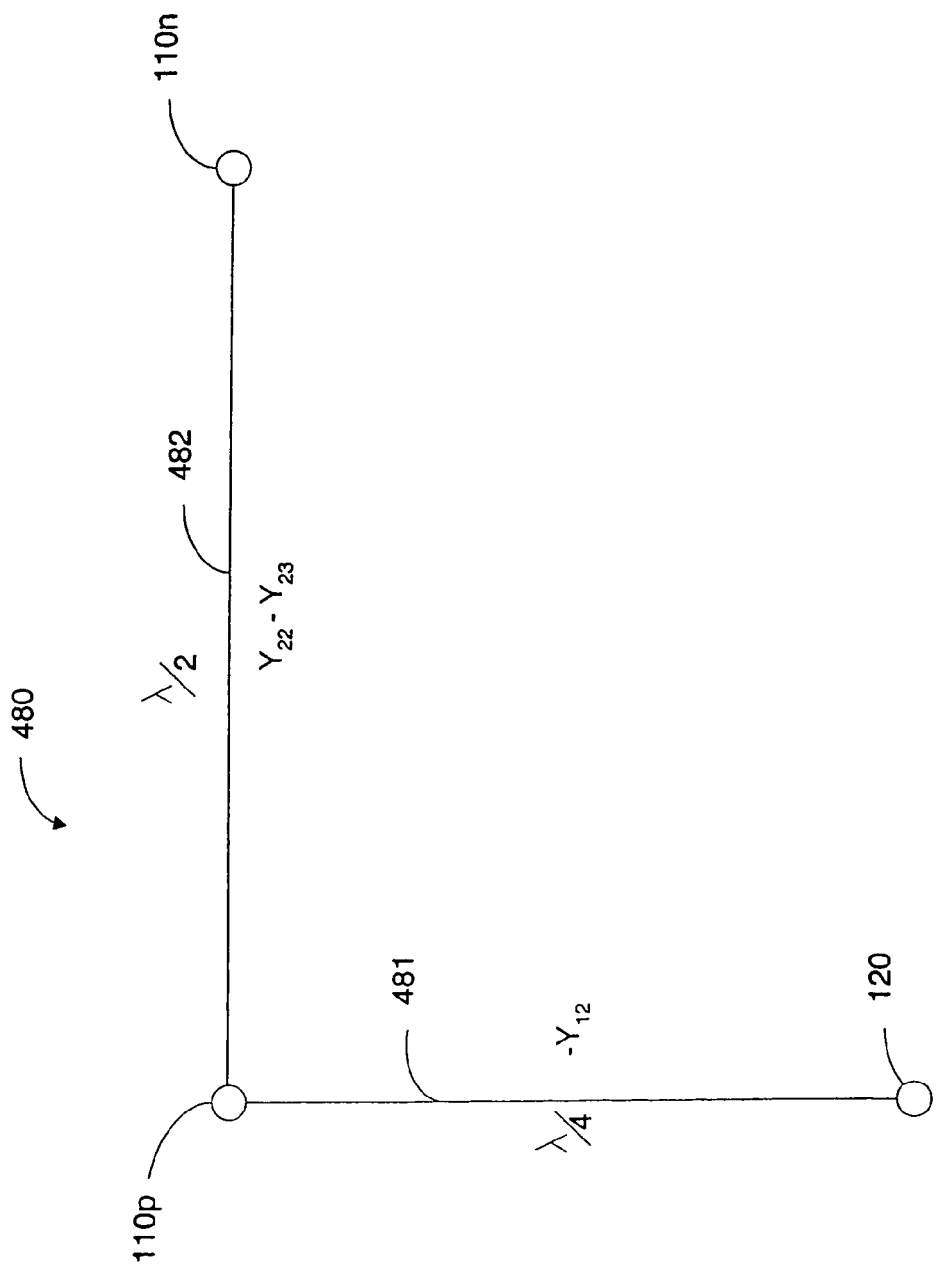

SYSTEM AND APPARATUS FOR A THREE-LINE BALUN WITH POWER AMPLIFIER BIAS

CROSS REFERENCE TO RELATED APPLICATIONS

This application is a continuation of U.S. patent application Ser. No. 11/119,156, filed Apr. 29, 2005, now U.S. Pat. No. 7,385,458, which is a continuation of U.S. patent application Ser. No. 10/613,346, filed Jul. 2, 2003, now U.S. Pat. No. 6,982,609, which is a continuation in-part of U.S. patent application Ser. No. 10/262,336, filed Sep. 30, 2002, now U.S. Pat. No. 7,283,793, which claims benefit of U.S. Provisional Application No. 60/381,387, filed May 15, 2002, all of which are incorporated herein by reference in their entirety.

BACKGROUND OF THE INVENTION

1. Field of the Invention

The present invention relates generally to antenna tuning circuits, and more particularly, to methods and systems for converting a balanced differential signal to an unbalanced signal and applying bias for active circuits.

2. Description of the Related Art

Transceiver power efficiency is greatly dependant on the efficiency of the transmitter power amplifier (PA). An efficient PA converts as much of the power supply direct current to RF output as possible. PA efficiency is especially important in portable transceiver systems that rely on a portable power source (e.g., battery) or other transmitters that have a limited power supply. Many portable transmitters are manufactured as highly integrated circuits (i.e., transmitter on a chip) so as to exploit the power efficiencies of integrated circuit design.

Some of the potential transmitter inefficiencies can be eliminated or significantly reduced in the design of the integrated power amplifier components. However, an integrated PA must still be connected to an antenna, impedance matching network, balancing circuits and other components that are external to the integrated transmitter on a chip. The parasitic capacitance in the output of the on-chip PA may not effectively be compensated for on the chip. This can be due to loss in signal power in resistive losses of on-chip passive components and ineffective use of silicon area due to large tuning components.

FIG. 1 shows a block diagram of a typical prior art transceiver 100. The transceiver 100 includes an integrated transmitter 104 that includes a differential power amplifier 110. The transceiver 100 also includes a front-end circuit 102. The front-end circuit 102 includes a balun 114. The differential PA 110 has a positive potential output 110p (positive port) and negative potential output 110n (negative port). The outputs 110p 110n of the PA 110 are coupled to the corresponding inputs 114p, 114n of the balun 114. The output 114A of the balun 114 is coupled to an antenna port 120.

The balun 114 is a balanced signal to unbalanced signal converter circuit that converts the balanced input signals 110n, 110p to an unbalanced or single pole output signal 114A, such as may be coupled to the single pole antenna port 120 to output a transmitter output signal.

FIG. 2 is a schematic of a typical three-line coupled balun 114. The balun 114 includes three lines 202, 204, 206 that are arranged to couple RF. Typically, each of the three lines 202, 204, 206 have a length of a quarter wavelength ($\lambda/4$). The first line 202 is connected to the positive port (i.e., positive differential output) 110p of the PA amplifier 110 at a first end and allowed to float, unconnected at a second end. The second line 204 is connected to the negative port (i.e. negative differential output) 110n of the PA amplifier 110 at a first end. A second end of the second line 204 is connected to a ground potential. The third line 206 is connected to the antenna port 120 at one end while the second end of the third line 206 is connected to a ground potential.

In a typical application such as in a 2.45 GHz transmitter output circuit, each of the lines 202, 204, 206 has an electrical length of a $\lambda/4$ or about 11 millimeters in a material with an effective dielectric constant of about 7.8. In a typical strip-line application the lines 202, 204, 206 are straight layouts that are arranged side by side in one conductive layer or are vertically aligned in adjacent metal layers. A straight line that is 11 mm in length is very large when compared to the physical size of a typical highly integrated transceiver 100.

DC power for the power amplifier devices 110 is typically supplied to the balun and to the PA through the output ports 110p, 110n. However, because the lines 202, 204 are not actually electrically connected as a DC path, then each of the PA output ports 110p, 110n require separate DC bias circuits.

Referring again to FIG. 1 above, each of the components in the front-end circuit 102 (e.g., the balun 114, the antenna 120 and the interconnecting conductors) has some level of parasitic capacitance that can load or otherwise degrade the efficiency of the PA 110. Similarly, each of the DC bias circuits can introduce imbalances in the PA output ports 110p, 110n. Requiring two DC bias circuits doubles the complexity of the DC bias circuitry, thereby doubling the resulting parasitic capacitance of the DC bias circuitry. Requiring two DC bias circuits also increases the likelihood of unintentionally introducing circuit imbalances to the PA output ports 110p, 110n that can be caused by even relatively slight differences in the two DC bias circuits.

In view of the foregoing, there is a need for a balun that allows a simplified DC bias path and is physically smaller than the prior art balun 114 while still maintaining the RF port arrangement described in FIGS. 1 and 2 above.

SUMMARY OF THE INVENTION

Broadly speaking, the present invention fills these needs by providing a three-line coupled balun. It should be appreciated that the present invention can be implemented in numerous ways, including as a process, an apparatus, a system, computer readable media, or a device. Several inventive embodiments of the present invention are described below.

One embodiment includes a balun that includes a first conductor, a second conductor and a third conductor. The first conductor has a first length. The first conductor also has a first end connected to a first balanced power amplifier output port. The second conductor has substantially the same first length. The second conductor also includes a first end connected to a second balanced power amplifier output port and a second end connected to a second end of the first conductor. The third conductor has substantially the same first length. The third conductor has a first end connected to an antenna port and a second end connected to a ground potential.

The first length can be substantially equal to an even multiple of the wavelength of a selected center frequency. The first length can be substantially equal to one-quarter wavelength of a selected center frequency.

In one embodiment the balun can also include a biasing network. The biasing network can include a fourth conductor that has a first end connected to the first balanced power amplifier output port and a second end connected to a bias supply. The fourth conductor can have substantially the same first length. The fourth conductor can have a length that has a reactance that offsets a parasitic capacitance of at least one of the first conductor, the second conductor, the third conductor, the first balanced PA port and the second balance PA port.

The first conductor, the second conductor and the third conductor can be formed in a multi-layer structure that includes multiple metal layers that are interleaved by multiple insulating via layers. The first conductor can be formed in a first metal layer. The second conductor can be formed in a second metal layer. The third conductor can be formed in a third metal layer in the multi-layer structure. The second end of the first conductor can be connected to the second end of the second conductor by a via connection formed in a via layer.

The first conductor, the second conductor, and the third conductor can be substantially, vertically aligned. The multi-layer structure can be bounded by a first ground plane and a second ground plane. The first ground plane and the second ground plane are separated by a distance H and the first conductor, the second conductor, and the third conductor are vertically offset less than ten times the distance H. The multi-layer structure can be formed in a homogenous medium. The multi-layer structure can be formed in at least one of LTCC, BT resin, Silicon, and FR4.

Another embodiment includes a transceiver front-end circuit. The transceiver front end circuit includes a first three coupled line balun and a second three coupled line balun. The first three coupled line balun can include a first conductor, a second conductor and a third conductor. The first conductor has a first length and a first end connected to a first balanced PA output port. The second conductor has substantially the same first length. The second conductor includes a first end connected to a second balanced PA output port and a second end connected to a second end of the first conductor. The third conductor has substantially the same first length. The third conductor has a first end connected to an antenna port and a second end connected to a ground potential. The second three coupled line balun includes a fourth conductor, a fifth conductor and a sixth conductor. The fourth conductor has substantially the same first length and a first end connected to a first balanced LNA input port. The fifth conductor has substantially the same first length. The fifth conductor includes a first end connected to a second balanced LNA input port and a second end connected to a second end of the fourth conductor. The sixth conductor has substantially the same first length and a first end connected to the antenna port and a second end connected to the ground potential.

The transceiver front-end circuit can also include a first switch and a second switch. The first switch is connected between the first balanced PA output port and the second balanced PA output port. The second switch connected between the first balanced LNA input port and the second balanced LNA input port.

The transceiver front-end circuit can also include a PA connected to the first balanced PA output port and the second balanced PA output port, and a LNA connected to the first balanced LNA input port and the second balanced LNA input port. The first switch can be included in the PA and the second switch can be included in the LNA.

The transceiver front-end circuit can also include a bias network connecting a bias source to the first balanced PA output port. The bias network can include a seventh conductor having a substantially the same first length.

One embodiment includes a balun that has an operating frequency RF equivalent circuit that includes a first conductor and a second conductor. The first conductor has a length of about one half wavelength of a selected center frequency. The first conductor has a first end coupled to a first balanced PA output port and a second end coupled to a second balanced PA output port. The second conductor has a length of about one quarter wavelength of the selected center frequency and a first end coupled to the first balanced PA output port and a second end coupled to an antenna port. The balun has a physical structure that includes a third conductor, a fourth conductor, and a fifth conductor. The third conductor having a length of about one quarter wavelength of a selected center frequency and a first end connected to the first balanced PA output port. The fourth conductor has a length of about one quarter wavelength of the selected center frequency. The fourth conductor includes a first end connected to the second balanced PA output port and a second end connected to a second end of the third conductor. The fifth conductor has a length of about one quarter wavelength of the selected center frequency. The fifth conductor has a first end connected to an antenna port and a second end connected to a ground potential.

The fourth conductor and the fifth conductor can be formed in a multi-layer structure that includes multiple metal layers that are interleaved by multiple insulating via layers. The third conductor can be formed in a first metal layer. The fourth conductor can be formed in a second metal layer. The fifth conductor can be formed in a third metal layer in the multi-layer structure.

The present invention provides the advantage of a more physically compact balun component that also allows biasing of the PA through the balun and single point tuning for parasitic reactance.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIGS. 4B through 4E illustrate the relationship of the equivalent circuit 300 to the three-line balun 400 according to one embodiment of the present invention.

DETAILED DESCRIPTION OF THE EXEMPLARY EMBODIMENTS

Several exemplary embodiments for a three-line coupled balun will now be described. It will be apparent to those skilled in the art that the present invention may be practiced without some or all of the specific details set forth herein.

A three-line coupled balun as described herein allows the power amplifier to be biased through a single DC input to the balun without significant impact to the balun's performance. Biasing the PA through the balun allows the balun to be used in an open source PA circuit that is one of the more commonly used PA circuits.

Figure 1:
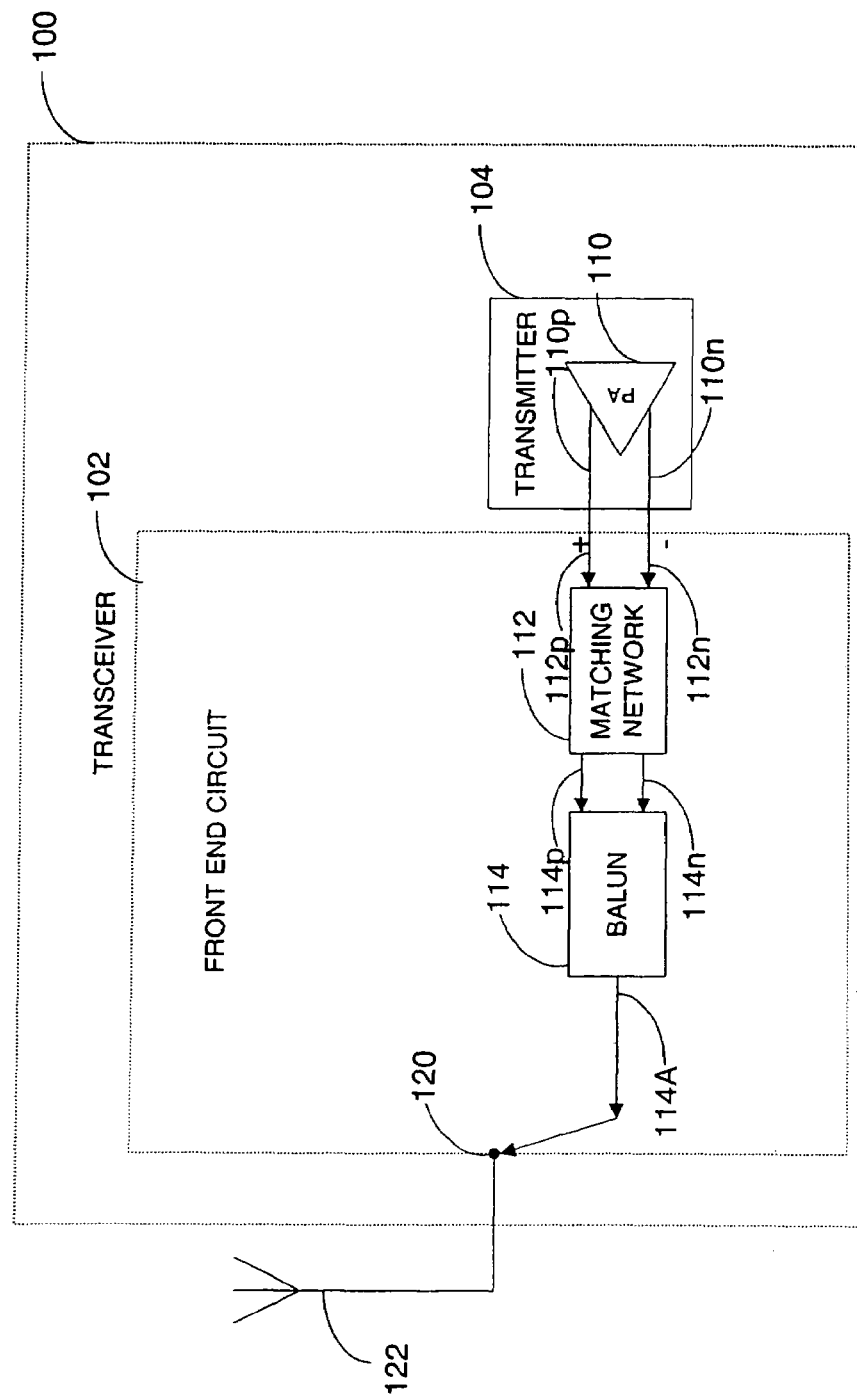
FIG. 1 shows a block diagram of a typical prior art transceiver.
Figure 2:
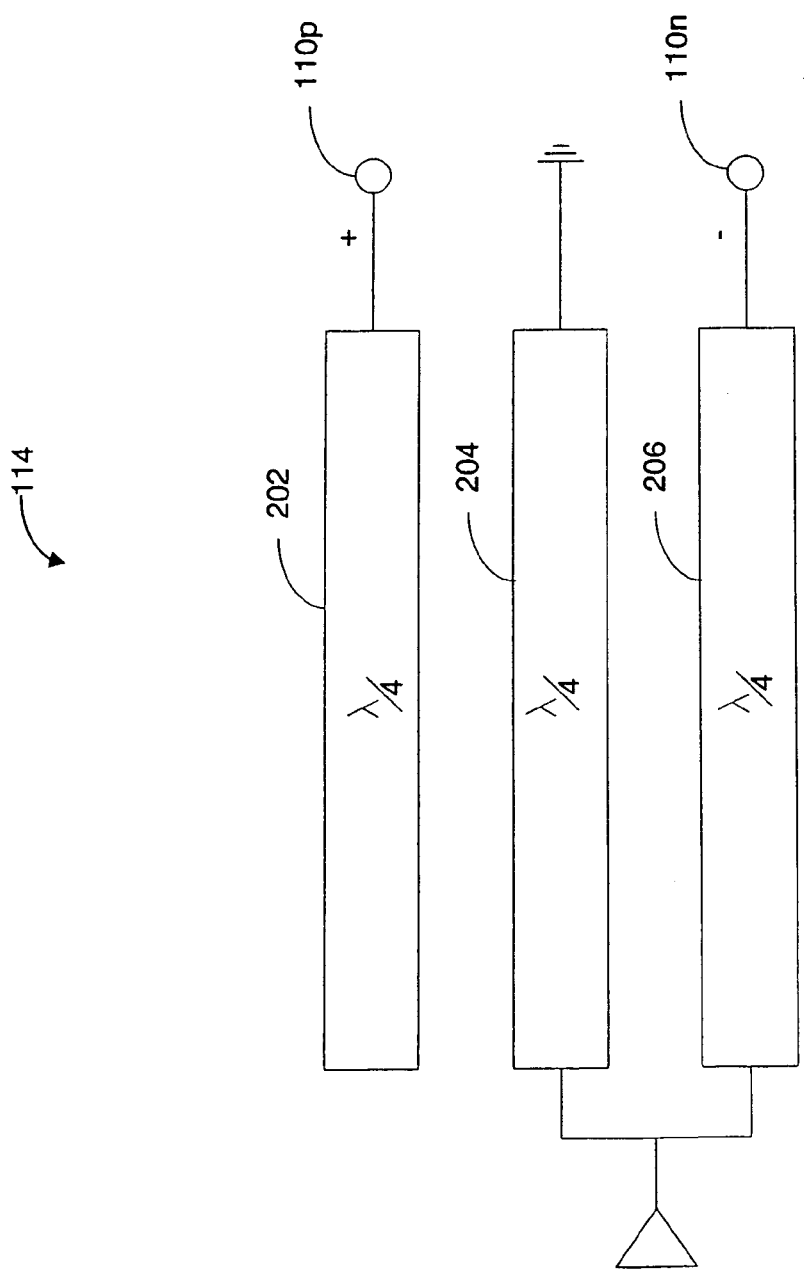
FIG. 2 is a schematic of a typical three-line coupled balun.
Figure 3:
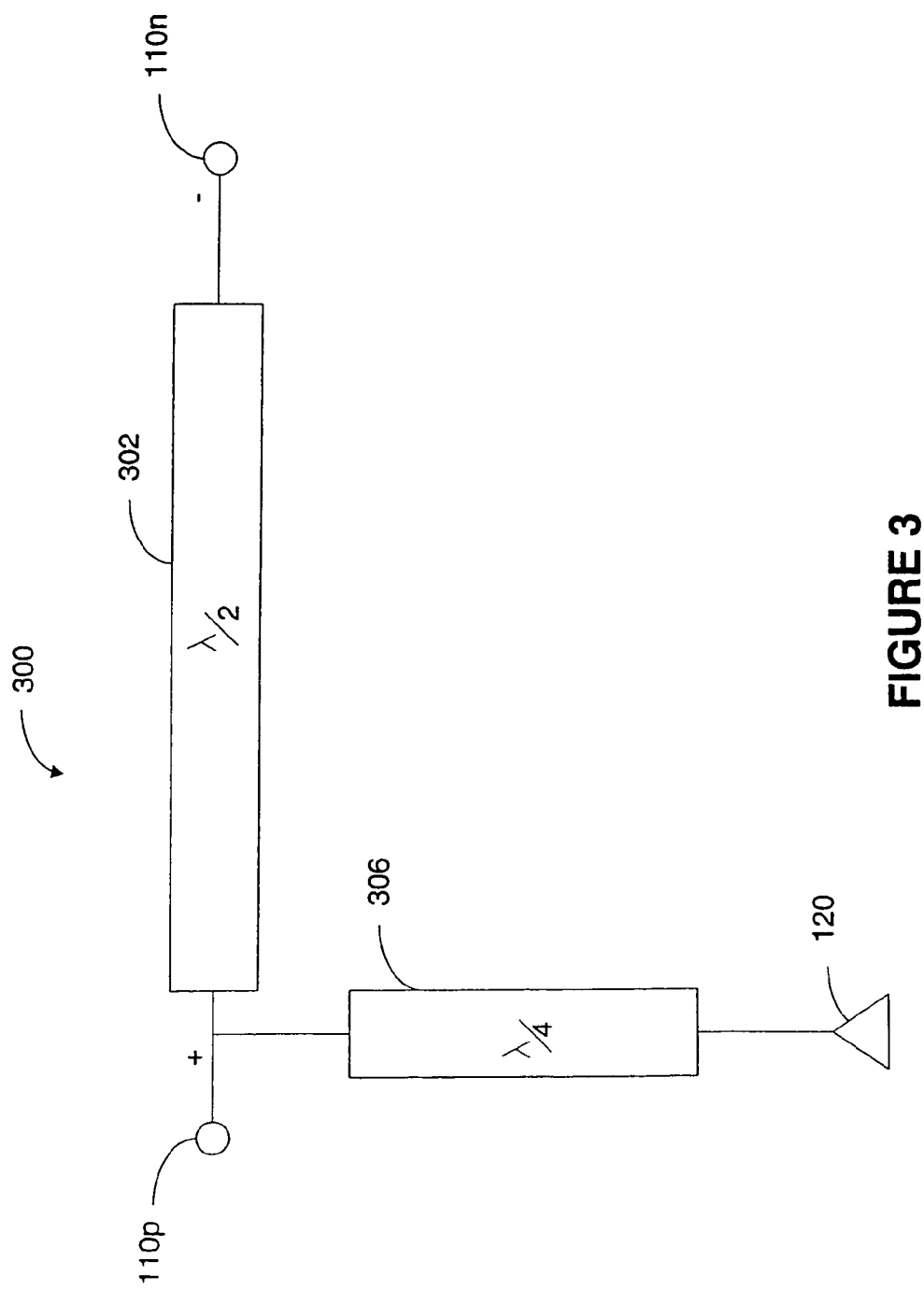
FIG. 3 shows an RF equivalent circuit of a class of coupled-line baluns.

FIG. 3 shows an RF equivalent circuit 300 of a class of coupled-line baluns. Element 302 is a half-wavelength ($\lambda/2$) in length. Element 302 is connected to the positive port 110p and the negative port 110n. Element 306 provides an impedance transformation and couples the single-ended port to the half-wavelength line. Baluns with an equivalent circuit 300 are advantageous because the half-wavelength line connecting the positive and negative ports collapses to a simple connection from an impedance point of view. That is, whatever reactance (or impedance) is connected to the positive port also appears at the negative port. This property can be exploited when simultaneously tuning and DC biasing the transmitter PA devices.

Figure 4A:
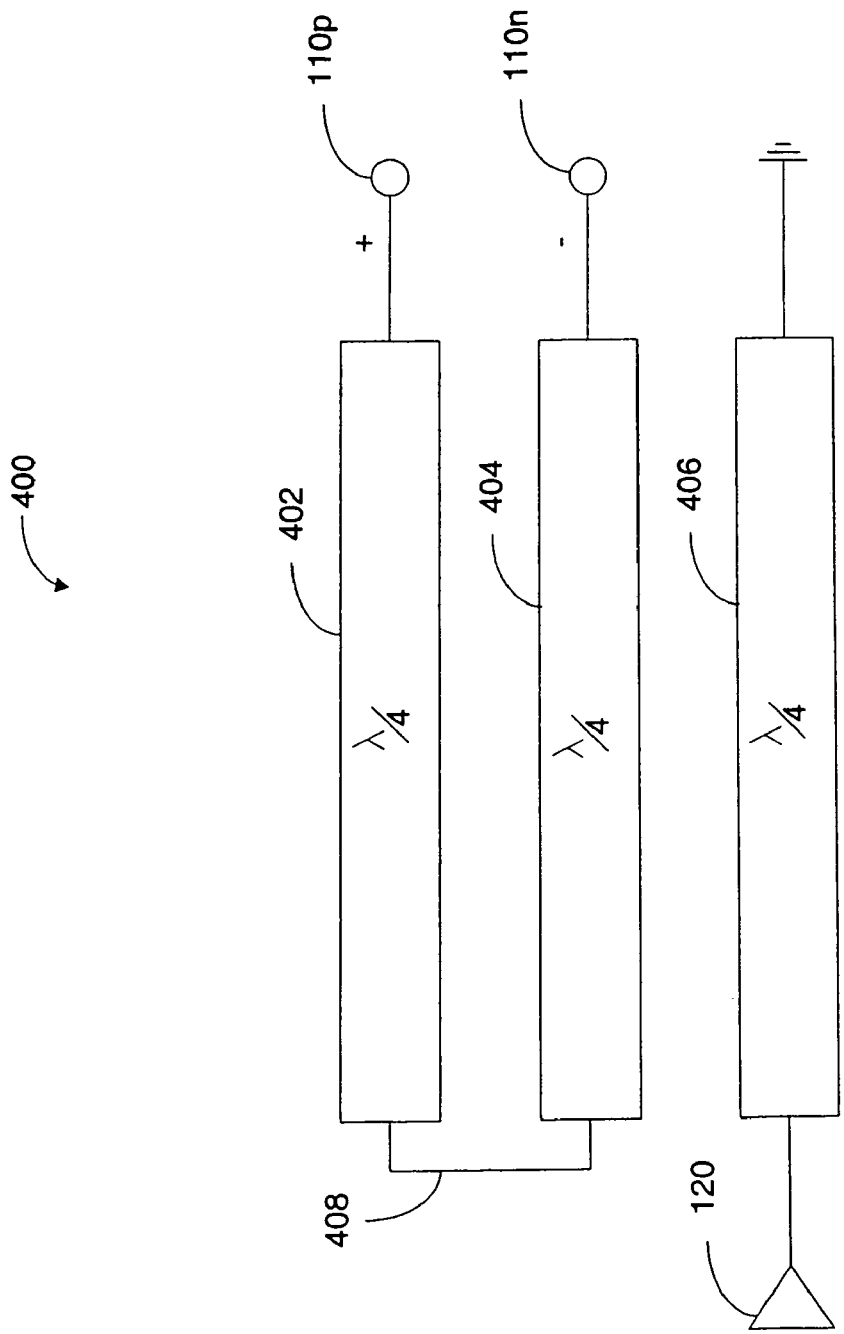
FIG. 4A is a schematic of a three-line balun according to one embodiment of the present invention.

FIG. 4A is a schematic of a three-line balun 400 according to one embodiment of the present invention. The balun 400 includes three coupled lines 402, 404, 406, each having a length of about $\lambda/4$. The coupled lines 402, 404 are connected together by conductor 408 so as to produce a DC electrical path between the positive port 110p and the negative port 110n.

$\lambda$ is equal to one full wave of a center frequency of an RF signal or 360 degrees of the RF signal. $\lambda/2$ is equal to 180 degrees of the RF signal. Therefore, an RF signal passing along a conductive line that has a length equal to about $\lambda/2$ will have about a 180-degree phase shift from one end of the conductive line to the other. If the signal is reflected back down the length of the $\lambda/2$ conductive line, then the originally input RF signal will be phase shifted 180-degrees in each direction or a total of 360 degrees so that the reflected RF signal is substantially the same phase and magnitude of the originally input RF signal and therefore will not substantially impact or interfere with he originally input RF signal. Therefore, a conductive line with a length of about a $\lambda/2$ acts as a short to the RF signal. Therefore, if a conductive line between positive port 110p and negative port 110n is approximately $\lambda/2$ in length, then an impedance or a capacitance applied at either of the positive port 110p or the negative port 110n will affect the RF signal substantially identically felt at both ports 110p, 110n.

Conversely, a conductive line having a length of about $\lambda/4$ causes an input RF signal to phase shift approximately 90-degrees and a reflected RF signal to be phase shifted approximately 180-degrees. A 180-degree phase shift form an RF short and substantially cancels out or interferes with the originally input RF current. Therefore, a conductive line with a length of about a $\lambda/4$ terminated in an RF short acts as an open to the RF circuit. For this reason, a very low impedance applied $\lambda/4$ down a conductive line from a port (e.g., either of the positive port 110p or the negative port 110n) will not affect the RF signal at the port.

Figure 4B:
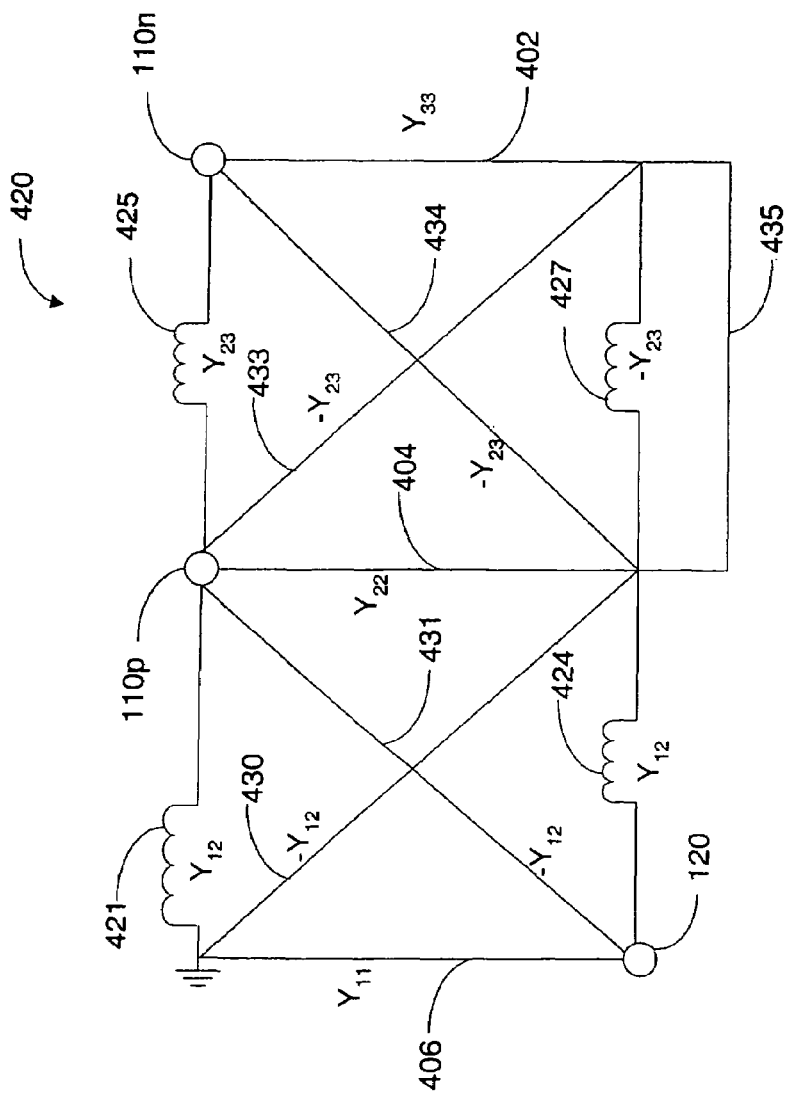

FIGS. 4B through 4E illustrate the relationship of the equivalent circuit 300 to the three-line balun 400 according to one embodiment of the present invention. FIG. 4B is a single line equivalent circuit 420 of the three-line balun 400 if lines 406 and 402 have an insignificant coupling as will be described in more detail below. Yij are elements of the coupled line characteristic admittance matrix. Elements 402, 404, 406, 430, 431, 433, 434 represent the admittance between the respective nodes 120, 110p, 110n and intersections of conductors 421, 424, 425, 427.

Figure 4C:
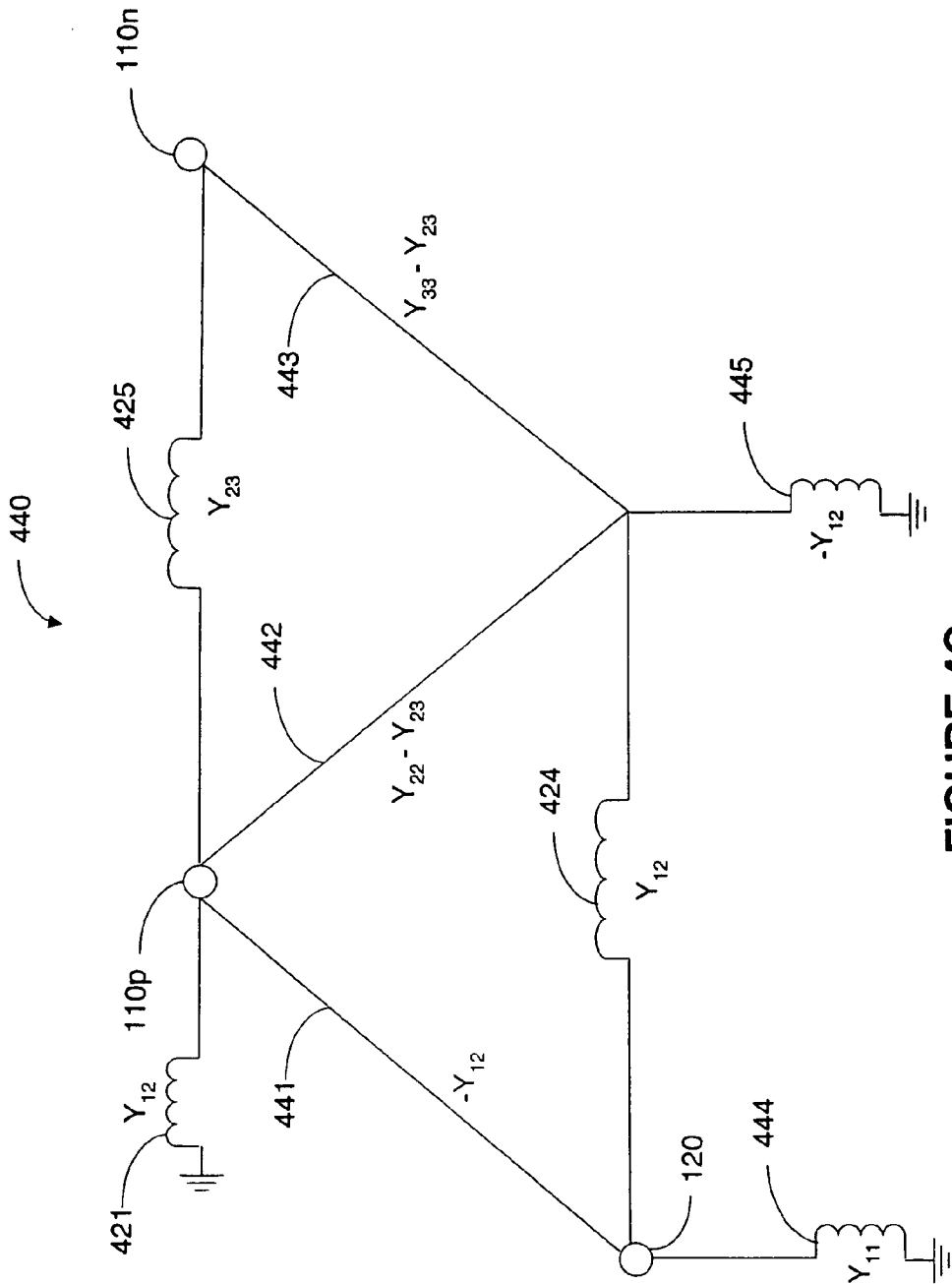
Figure 4D:
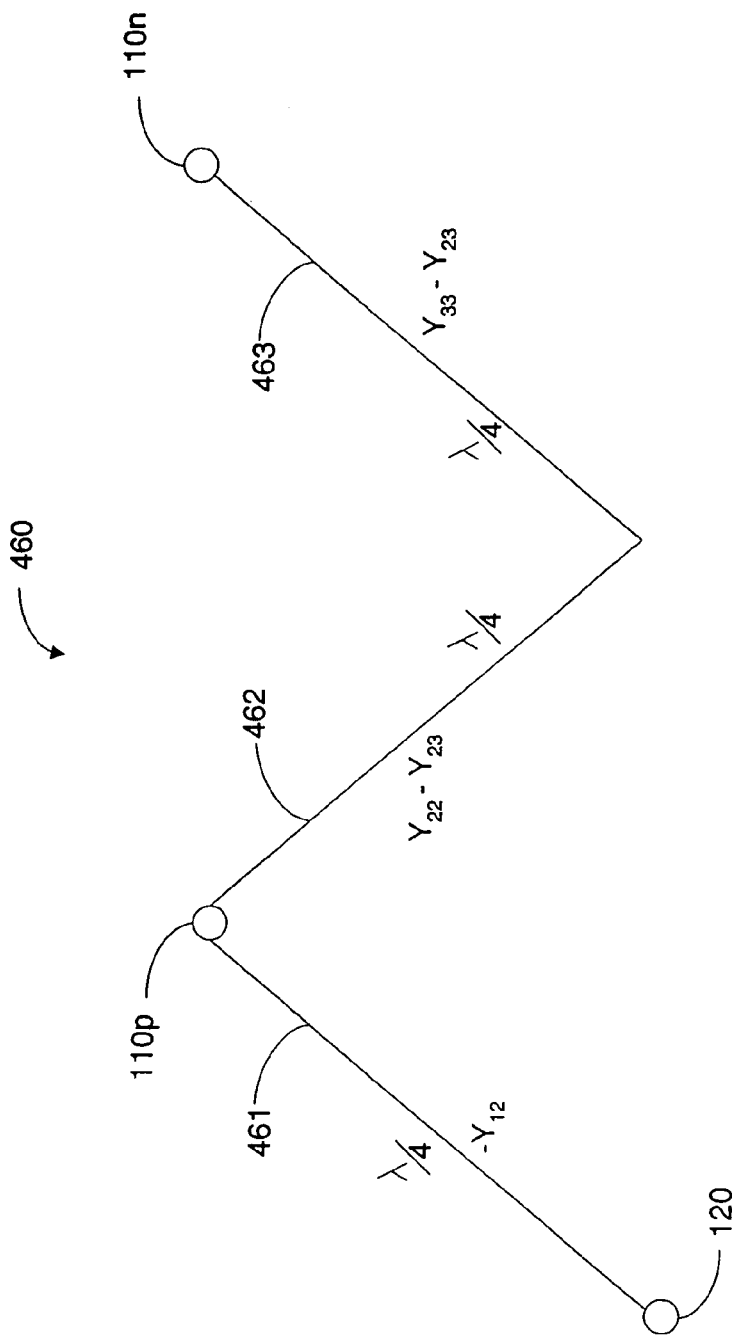

The equivalent circuit 420 can be reduced to the equivalent circuit 440 shown in FIG. 4C. The electrical lengths of conductors 425, 424, 421 are the same. At a selected center frequency, when the electrical lengths of conductors 425, 424, 421 are equal to $\lambda/4$, the equivalent circuit 440 can be reduced to the equivalent circuit 460 shown in FIG. 4D. When Y33=Y22, then the equivalent circuit 460 can be reduced to the equivalent circuit 480 shown in FIG. 4E.

Figure 4F:
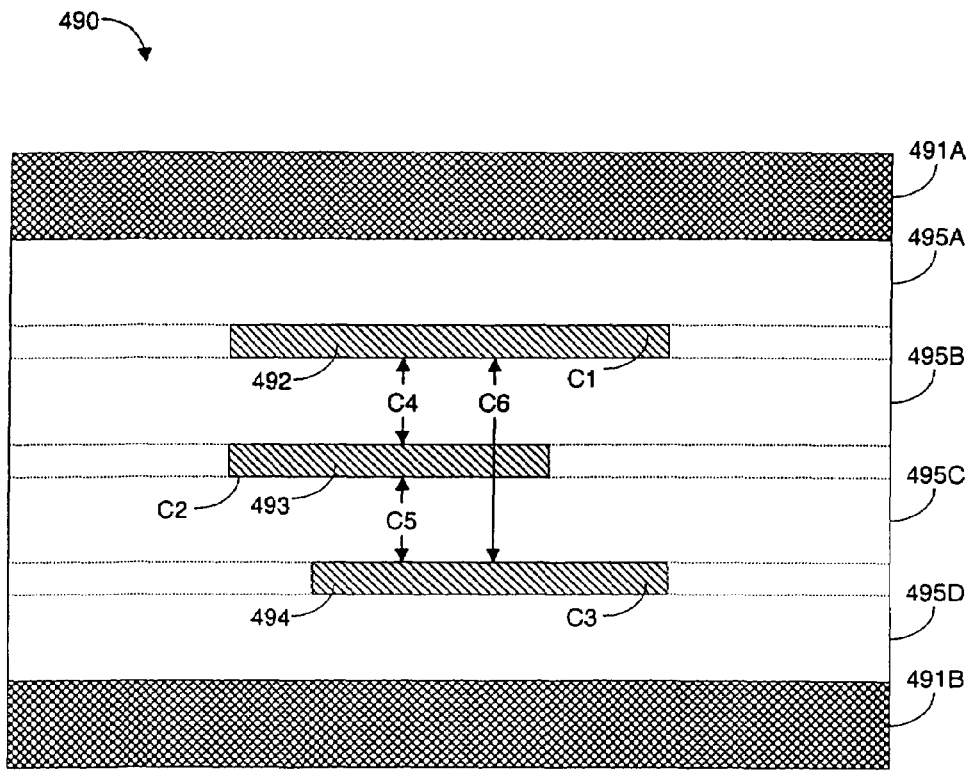
FIG. 4F is a capacitance diagram of a three-line balun in accordance with one embodiment of the present invention.

FIG. 4F is a capacitance diagram of a three-line balun 490 in accordance with one embodiment of the present invention. The multi-layer three-line balun 490 includes two ground planes 491A, 491B. The three lines 492, 493, 494, form the balun 490. Dielectric layers 495A-D separate the lines 492, 493, 494 from one another and the ground planes 491A, 491B. Line 494 is the unbalanced single line side and lines 492, 493 form the balanced side of the balun 490. Various capacitances are formed between the various conductive paths 492, 493, 494, 491A, 491B. Each of the lines 492, 493, 494 have a respective "self capacitance" C1, C2, C3. The self-capacitance of each line is equal to the amount of capacitance that exists between different portions of the line. The self-capacitance C1 and C2 of the balanced lines 492, 493 are substantially equal.

A capacitance between the lines 492, 493, 494 also exists. Capacitances between two adjacent layers of the multi-layer balun 490 are substantially equal. However the capacitance between two nonadjacent layers is substantially less than the capacitance between adjacent layers. By way of example, a capacitance C4 between line 492 and line 493 is substantially equal to a capacitance C5 between lines 493 and lines 494. However, a capacitance C6 between line 492 and line 494 is substantially less than (i.e., at least about ⅕) either of C4 or C5. The actual amount of the self-capacitance and the capacitances between each of the lines 492, 493, 494 is determined by the physical geometry of the balun 490 and the properties of the dielectric that separates the lines.

A characteristic admittance matrix [Y] is related to the capacitance matrix [C] described above by the following relationship:

$$[Y] = \frac{1}{\sqrt{\mu\varepsilon}}[C]$$

where $\mu$ is equal to the permeability of the dielectric medium and where $\varepsilon$ is equal to the permittivity of the dielectric medium.

The three line baluns described herein have a relatively low propagation loss (e.g., less than about 0.8 db) as the signal passes through the balun. This relatively propagation low loss is achieved through a combination of a low resistance conductor and low dielectric losses.

While FIG. 4F shows the three-line balun 490 in a multi-layer arrangement, it should be understood that the three lines 492, 493, 494 forming the balun 490 could also be arranged in a single conductive layer with substantially the same capacitive qualities as described above in the multi-layer arrangement. Therefore, the present invention should not be limited to a multi-layer arrangement.

Figure 5:
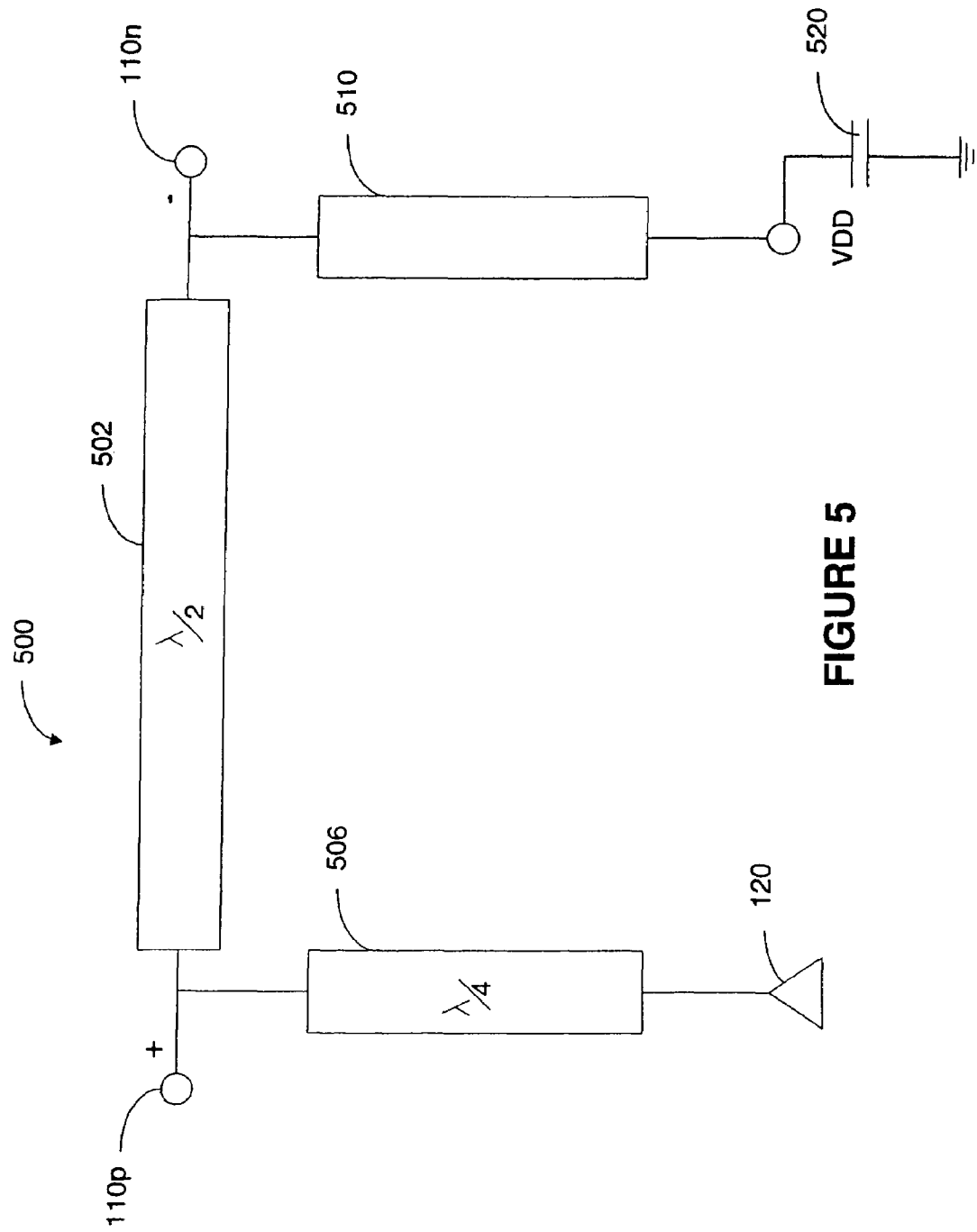
FIG. 5 is an RF equivalent circuit for the three-line balun at the operating frequency according to one embodiment of the present invention.

FIG. 5 is an RF equivalent circuit 500 for the three-line balun 400 at the operating frequency according to one embodiment of the present invention. The equivalent circuit 500 includes a reactive bias and tuning element 510 and a bypass capacitor 520. The reactive bias element 510 and the bypass capacitor 520 provide a bias network to couple the bias current from the VDD source. The length of the reactive bias element 510 can be adjusted to compensate and tune for parasitic capacitances in the output circuit. Stub 506 provides impedance matching tuning such as matching a 50-ohm output to a 300-ohm input.

Conductor 408 provides a DC electrical path between the positive port 110p and the negative port 110n so that a bias voltage VDD can be applied to one of the ports 110p, 110n and will be conducted to the other port. As shown, the bias voltage VDD is connected to the negative port 110n.

A tuning stub 510 is used to connect VDD to the negative port 110n. The tuning stub 510 can block the RF from entering the bias voltage supply VDD if the tuning stub has a length of about $\lambda/4$. The length of the tuning stub 510 can also be adjusted to compensate for a parasitic capacitance that may exist in the PA output circuit 400 such as in the antenna port 120 or in one or more of the conductive lines 402, 404, 406. As described above, a single parasitic compensation element (e.g., tuning stub 510) on only one of the balanced ports 110p, 110n will effect the RF signal equally on both of the ports 110p, 110n. Because only a single parasitic compensation element is required there is no longer a requirement of identical or symmetrical tuning elements, which simplifies the overall circuit construction and also allows the manufacturing tolerances to be substantially reduced, which can also reduce cost and further simplify construction.

Figure 6:
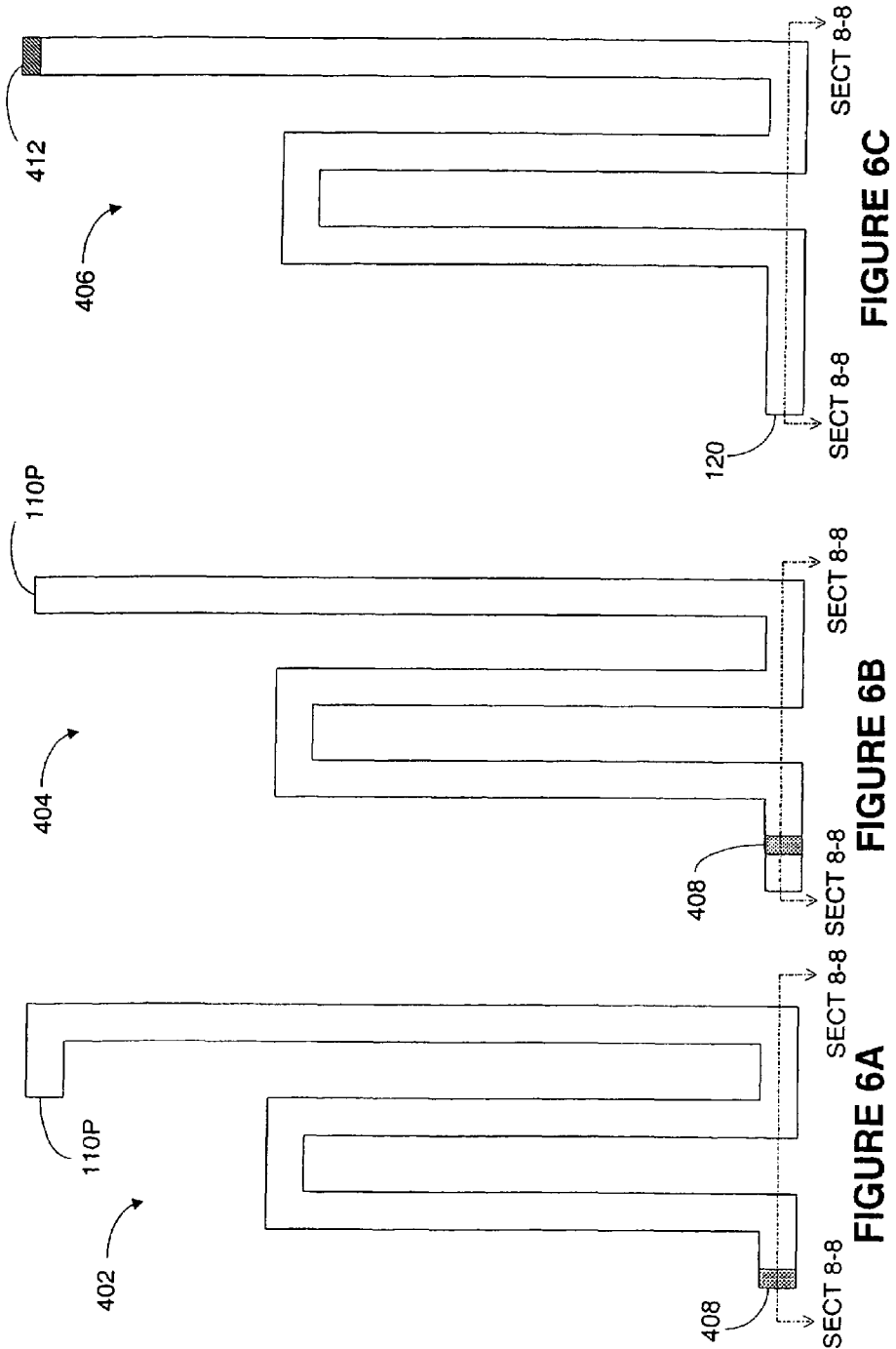
FIGS. 6A through 6C show a layout view of each of the conductive lines in accordance with one embodiment of the present invention.

FIGS. 6A through 6C show a layout view of each of the conductive lines 402, 404, 406, in accordance with one embodiment of the present invention. FIG. 6A shows conductive line 402. A first end of the conductive line 402 is connected to the positive PA port 110p. A second end of the conductive line 402 is connected to conductive line 404 by the conductor 408 as will be described in more detail in FIG. 7 below.

FIG. 6B shows conductive line 404. A first end of the conductive line 404 is connected to the negative PA port 110n. A second end of the conductive line 404 is connected to conductive line 402 by the conductor 408 as will be described in more detail in FIG. 7 below.

FIG. 6C shows conductive line 406. A first end of the conductive line 406 is connected to a ground potential (e.g., a ground plane) through conductor 412 as will be described in more detail in FIG. 7 below. A second end of the conductive line 406 is connected to the antenna port 120.

Figure 7:
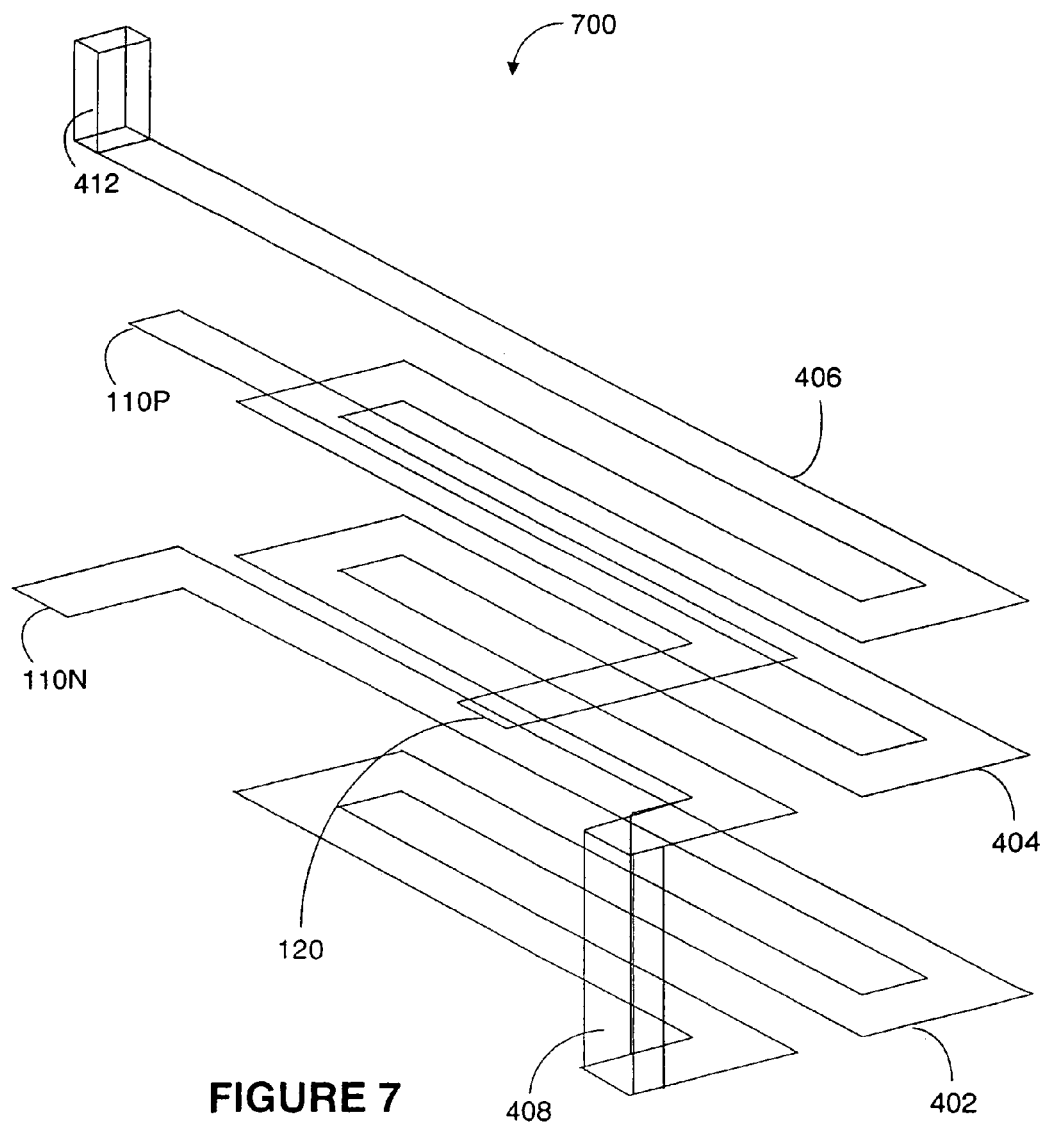
FIG. 7 is a three-dimensional view of the three coupled lines as they are arranged in a multi-layer structure, in accordance with one embodiment of the present invention.

FIG. 7 is a three-dimensional view 700 of the three coupled lines 402, 404, 406 as they are arranged in a multi-layer structure, in accordance with one embodiment of the present invention. The multi-layer structure can be any strip-line type homogeneous medium such as low temperature co-fired ceramic (LTCC), silicon, various resins and composite materials such as BT resin and FR4 that are well known in the art. Forming the three coupled lines 402, 404, 406 in a multi-layer structure allows the physical size of the balun 400 to be compacted over prior art approaches as each layer only has one coupled line that is about $\lambda/4$ in length. Each of the coupled lines 402, 404, 406 can be arranged close to itself so as to further reduce the physical size.

Figure 8:
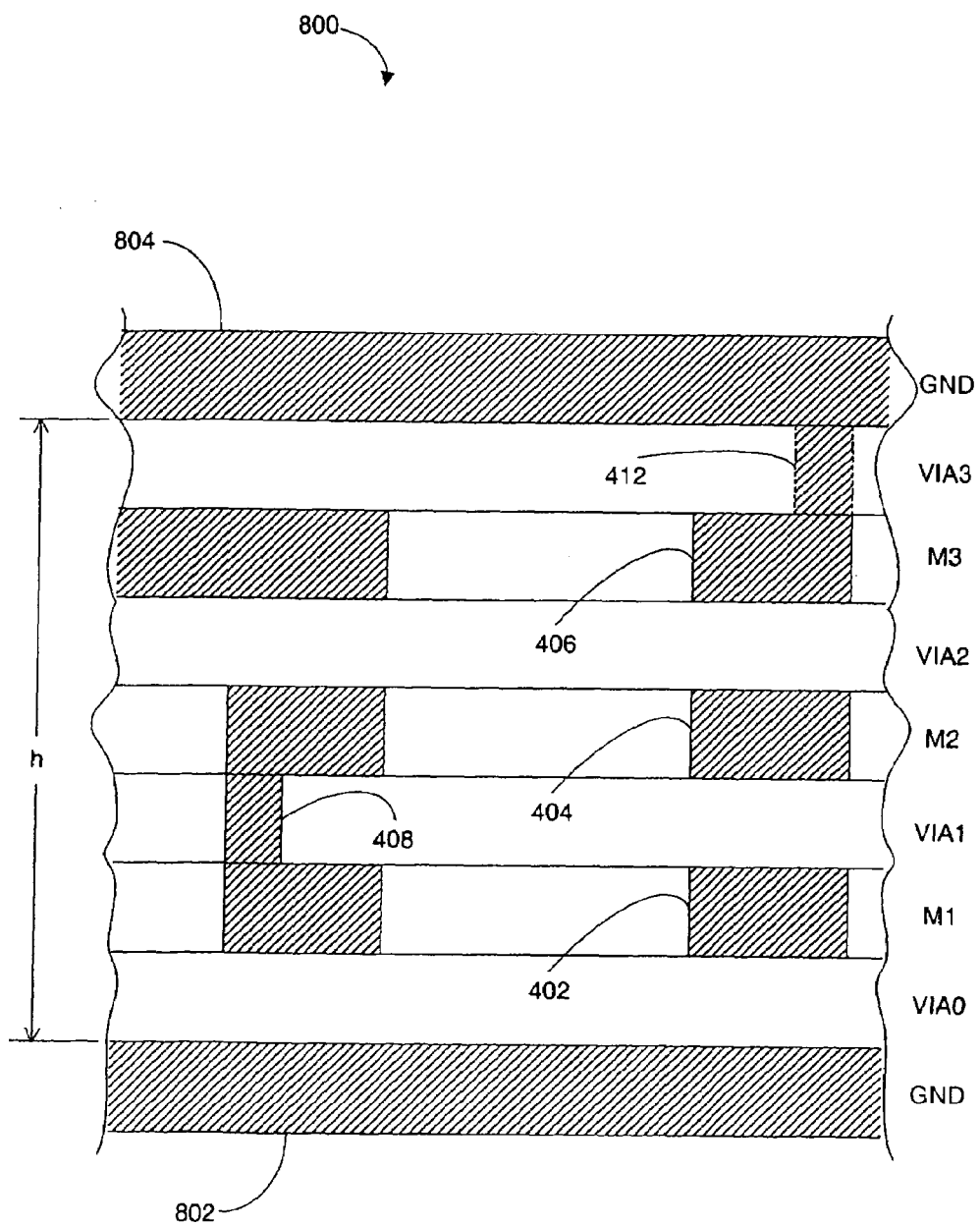
FIG. 8 is a sectional view of the three coupled lines in accordance with one embodiment of the present invention.

FIG. 8 is a sectional view 800 of the three coupled lines 402, 404, 406, in accordance with one embodiment of the present invention. The sectional view 800 is not drawn to scale. Specifically the vertical dimensions of the sectional view 800 are exaggerated so as to more easily illustrate features and aspects of the three coupled lines 402, 404, 406.

The three coupled lines 402, 404, 406 are formed in several metal layers M1, M2, M3. The metal layers M1, M2, M3 are separated by insulating via layers VIA0, VIA1, VIA2, VIA3. The metal layers M1, M2, M3 and the via layers VIA0, VIA1, VIA2, VIA3 are bounded by two ground planes 802, 804. More or fewer metal layers and via layers could also be used in alternative embodiments.

H is the distance between the ground planes 802, 804. The three coupled lines 402, 404, 406 can be substantially vertically aligned, as shown. Alternatively, the three coupled lines 402, 404, 406 can be offset horizontally by an amount less than about 10H because the majority of RF signal will be coupled between the three coupled lines 402, 404, 406 if the three coupled lines are closer than about 10 times the distance H between the ground planes 802, 804. As the offset distance between the three coupled lines 402, 404, 406 increases additional amounts of the RF signal will be coupled directly to one or more of the ground planes 802, 804.

In one embodiment, conductors 408 and 412 are formed as vias in via layers VIA1 and VIA3, respectively. Conductor 408 is formed in via layer VIA1 to connect conductive lines 402, 404 together. Similarly, conductor 412 is formed in via layer VIA3 to connect conductive line 406 to ground plane 804.

Figure 9:
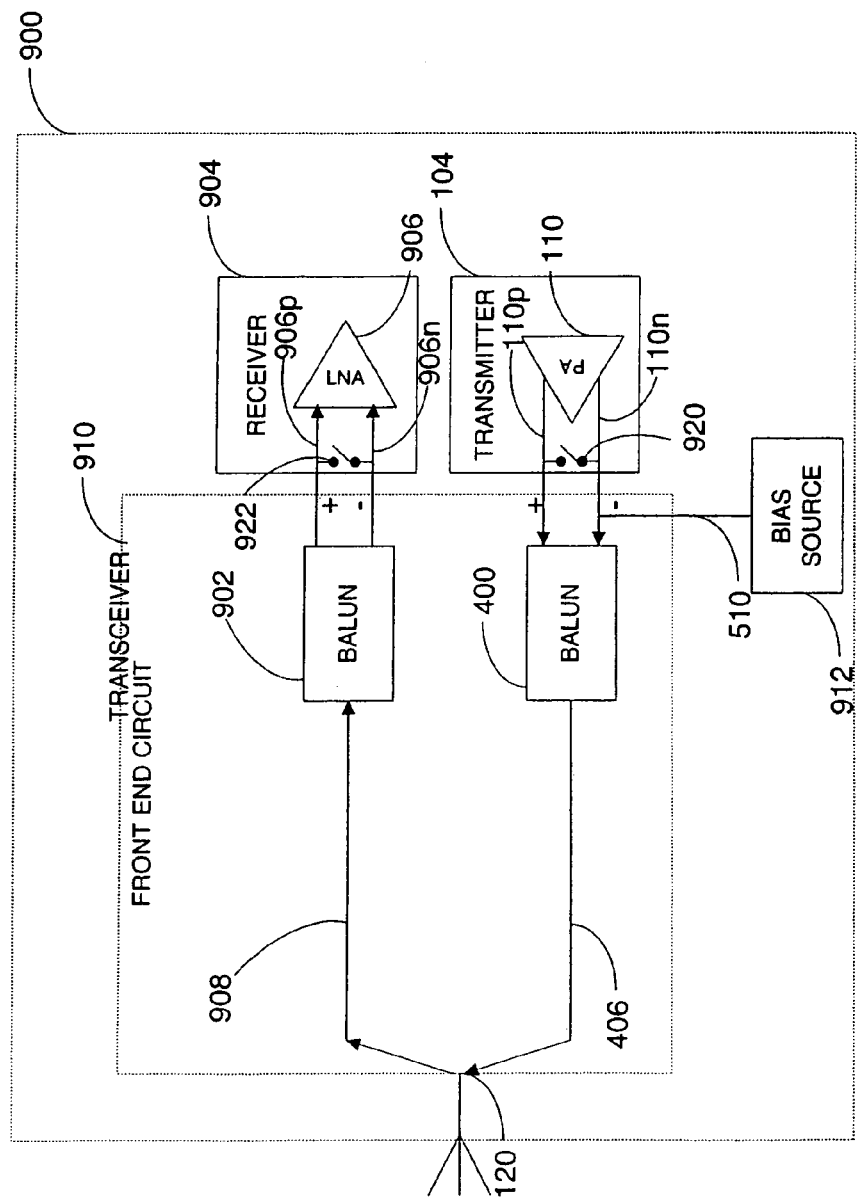
FIG. 9 shows a transceiver circuit that includes a receiver that has a low noise amplifier that has balanced receiver inputs.

Referring again to FIGS. 6A and 6B above, fourth conductor (not shown) can be connected to ports 110p or 110n by way of a via or located in the same metal layer M1, M2 respectively. The fourth conductor can form the tuning stub 510 described in FIG. 5 above to connect the PA bias source 912 (as shown in FIG. 9 below) to the PA output ports 110n, 110p.

The tuning stub 510 can be a quarter wavelength ($\lambda/4$) RF-shorted stub (e.g., through capacitor 520) as a quarter wavelength stub is an open to RF and therefore will protect the signal path form any significant loss of signal. However, if the PA requires reactive tuning, the PA bias network (i.e., tuning stub 510) is not limited to a precise quarter wavelength RF stub and the PA bias network can therefore be adjusted to various lengths to provide the desired reactance.

As described above, a coupled three-line balun 400 can be very useful in a transmit signal path (i.e., as part of a transmitter front end circuit 102). However, a coupled three-line balun can provide similar benefits in a receive signal path. FIG. 9 shows a transceiver circuit 900 that includes a receiver 904 that has a low noise amplifier 906 that has balanced receiver inputs 906p, 906n. A receiver balun 902 is included in the front-end circuit 910. A conductor 908 connects to the receiver balun 902 to the antenna port 120.

As described above, because the conductive lines 402, 404, 406 are $\lambda/4$ in length, then the phase of the RF signal is shifted 90 degrees. The 90-degree phase shift is reflected back to the beginning of a $\lambda/4$ conductive line to create a 180-degree phase shift. The 180-degree phase shift of the RF signal can also be viewed as a 180-degree shift in impedance. As a result a small impedance at one end of a $\lambda/4$ conductive line is reflected as a very large impedance at the opposite end of the $\lambda/4$ conductive line. Therefore, as shown in FIG. 9, if a switch 920 is placed across the PA ports 110p, 110n, then when the switch 920 is closed (i.e., a closed switch 920 is a short which is a very small impedance) then a very large impedance is reflected to the antenna port 120. Conversely, if the switch 920 is open (i.e., an open switch 920 is an open circuit which is a large impedance), then a very small impedance is reflected to the antenna port 120.

Similarly, if a switch 922 is placed across the LNA ports 906p, 906n, then when the switch 922 is closed (i.e., a closed switch 922 is a short which is a very small impedance) then a very large impedance is reflected to the antenna port 120. Conversely, if the switch 922 is open (i.e., an open switch 922 is an open circuit which is a large impedance), then a very small impedance is reflected to the antenna port 120.

As described above, switches 920, 922 can be used to perform a transmit/receive path switching function so that the transmitter 104 and the receiver 904 can use the same antenna port. By way of example, in transmit mode, switch 922 is closed which reflects a large impedance to the antenna port 120 and switch 920 is open. Therefore the transmitted RF proceeds out of the PA 110 through the balun 400 to the antenna port 120. At the antenna port 120, the RF can travel toward the antenna or toward the receiver balun 902, however, because switch 922 is closed, the RF sees a large impedance in the receiver balun 902 as compared to relatively small impedance of the antenna. Therefore the majority of the transmit RF signal continues out the antenna.

Similarly in receive mode, switch 920 is closed which reflects a high impedance toward the antenna port 120. Switch 922 is open which reflects a low impedance to the antenna port 120. A small amplitude RF receive signal enters the antenna 122 to the antenna port 120. At the antenna port 120, the small receive signal sees the large impedance of the transmit balun 400 and the relatively small impedance of the receive balun 902. As a result the majority of the receive RF signal is conducted to the receiver balun 902 and into the LNA 906.

Because switches 920 and 922 do not transfer high power signals, the switches 920, 922 can be relatively small devices. A smaller switch device uses less power that a larger switch device so therefore the smaller switches 920 and 922 are more efficient than a conventional T/R switch that is much larger and more complicated.

Another benefit of the three-line coupled balun 400 is the inherent electrostatic discharge protection function. Since the antenna port 120 is tied to ground potential (i.e., ground plane 804) through conductor 412, then a static discharge that is received at the antenna port 120 will be conducted to ground rather than transferred through the balun 400 and into the transmitter 104 or in the case of a receiver balun 902, into the LNA 904.

As used herein the term "about" means +/−10%. By way of example, the phrase "about 250" indicates a range of between 225 and 275.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A balun, formed in a multi-layer structure including a plurality of metal layers, comprising:
   a first conductor having a first length, formed in a first metal layer of the multi-layer structure;
   a second conductor having a second length substantially similar to the first length, formed in a second metal layer of the multi-layer structure, connected to the first conductor; and
   a third conductor having a third length substantially similar to the first length, formed in a third metal layer of the multi-layer structure,
   wherein the second metal layer is disposed between the first metal layer and the third metal layer.

2. The balun of claim 1, wherein the plurality of metal layers are interleaved by a plurality of insulating layers.

3. The balun of claim 2, wherein the plurality of insulating layers includes:
   a first insulating layer to separate a first ground plane and the first metal layer;
   a second insulating layer to separate the first metal layer and the second metal layer;
   a third insulating layer to separate the second metal layer and the third metal layer; and
   a fourth insulating layer to separate the third metal layer and a second ground plane.

4. The balun of claim 1, further comprising:
   a fourth conductor, formed in a first insulating layer of the multi-layer structure, to connect the first conductor and the second conductor.

5. The balun of claim 1, further comprising:
   a fifth conductor, formed in a first insulating layer of the multi-layer structure, to connect the third conductor to a first ground plane.

6. The balun of claim 1, wherein the first conductor includes a first end connected to a first port.

7. The balun of claim 6, wherein the first port is coupled to a first balanced output port of a power amplifier.

8. The balun of claim 6, wherein the second conductor includes a first end connected to a second port and a second end connected to a second end of the first conductor.

9. The balun of claim 8, wherein the second port is coupled to a second balanced output port of a power amplifier.

10. The balun of claim 1, wherein the third conductor includes a first end connected to an antenna port and a second end connected to a ground potential.

11. A balun formed in a multi-layer structure including a plurality of metal layers interleaved by a plurality of insulating layers comprising:
    a first conductor having a first length, formed in a first metal layer of the multi-layer structure, the first conductor having a first end connected to a first port;
    a second conductor having a second length substantially similar to the first length, formed in a second metal layer of the multi-layer structure, the second conductor includes:
    a first end connected to a second port, and
    a second end connected to a second end of the first conductor; and
    a third conductor having a third length substantially similar to the first length, formed in a third metal layer of the multi-layer structure, the third conductor having a first end connected to an antenna port and a second end connected to a ground potential.

12. The balun of claim 11, wherein the first length is substantially equal to an even multiple of the wavelength of a selected center frequency.

13. The balun of claim 11, wherein the first length is substantially equal to one-quarter wavelength of a selected center frequency.

14. The balun of claim 11, further comprising:
    a biasing network having a fourth conductor having a first end connected to the first port and a second end connected to a bias supply.

15. The balun of claim 14, wherein the fourth conductor has a fourth length substantially similar to the first length.

16. The balun of claim 15, wherein the fourth length has a reactance that offsets a parasitic capacitance of at least one of the first conductor, the second conductor, the third conductor.

17. The balun of claim 11, wherein the first conductor, the second conductor, and the third conductor are substantially vertically aligned.

18. The balun of claim 11, wherein the multi-layer structure is bounded by a first ground plane and a second ground plane.

19. The balun of claim 18, wherein the first ground plane and the second ground plane are separated by a distance H and the first conductor, the second conductor, and the third conductor are vertically offset less than ten times the distance H.

20. The balun of claim 11, wherein the multi-layer structure is formed in at least one of a group of mediums consisting of LTCC, BT resin, Silicon, and FR4.

* * * * *

UNITED STATES PATENT AND TRADEMARK OFFICE
CERTIFICATE OF CORRECTION

PATENT NO. : 7,595,704 B2
APPLICATION NO. : 12/076721
DATED : September 29, 2009
INVENTOR(S) : McKay et al.

It is certified that error appears in the above-identified patent and that said Letters Patent is hereby corrected as shown below:

Column 5, line 45 in the Specification, "he" should be replaced by --the--.

Column 8, line 53 in the Specification, "a/4" should be replaced by --$\lambda/4$--.

Signed and Sealed this

Twenty-seventh Day of April, 2010

David J. Kappos
*Director of the United States Patent and Trademark Office*